US011721236B2

(12) United States Patent
Mikic et al.

(10) Patent No.: US 11,721,236 B2
(45) Date of Patent: Aug. 8, 2023

(54) METHOD AND SYSTEM FOR MODELING AERODYNAMIC INTERACTIONS IN COMPLEX EVTOL CONFIGURATIONS FOR REALTIME FLIGHT SIMULATIONS AND HARDWARE TESTING

(71) Applicant: Joby Aero, Inc., Santa Cruz, CA (US)

(72) Inventors: Gregor Veble Mikic, Santa Cruz, CA (US); JoeBen Bevirt, Santa Cruz, CA (US); Alex Stoll, Santa Cruz, CA (US); Jeremy Bain, Stockbridge, GA (US)

(73) Assignee: Joby Aero, Inc., Santa Cruz, CA (US)

( * ) Notice: Subject to any disclaimer, the term of this patent is extended or adjusted under 35 U.S.C. 154(b) by 425 days.

(21) Appl. No.: 17/079,514

(22) Filed: Oct. 25, 2020

(65) Prior Publication Data

US 2021/0125515 A1    Apr. 29, 2021

Related U.S. Application Data

(60) Provisional application No. 62/925,957, filed on Oct. 25, 2019.

(51) Int. Cl.
    *G09B 9/24*    (2006.01)
    *G06F 30/28*    (2020.01)

(52) U.S. Cl.
    CPC ............... *G09B 9/24* (2013.01); *G06F 30/28* (2020.01)

(58) Field of Classification Search
    CPC .. G09B 9/24; G09B 9/206; G09B 9/10; G06F 30/28; G06F 30/20
    See application file for complete search history.

(56) References Cited

U.S. PATENT DOCUMENTS

| 7,092,845 B2 | 8/2006 | Keane et al. |
| 7,668,705 B2 | 2/2010 | Kalitzin et al. |
| 8,506,300 B2 | 8/2013 | Baranov et al. |

(Continued)

FOREIGN PATENT DOCUMENTS

| EP | 493072 A2 * | 7/1992 | ......... G06F 17/5018 |
| EP | 0493072 A2 | 7/1992 | |

(Continued)

OTHER PUBLICATIONS

PCT/US2020/057260 International Search Report and Written Opinion, dated Apr. 12, 2021.

*Primary Examiner* — Rehana Perveen
*Assistant Examiner* — Troy A Maust
(74) *Attorney, Agent, or Firm* — Michael A. Guth

(57) ABSTRACT

A method and system for modeling aerodynamic interactions in complex eVTOL configurations for realtime flight simulations and hardware testing which includes decomposing the aircraft into aerodynamic subcomponents, wherein the interactions between these components are handled by flow simulations of the surrounding fluid, which may be Euler flow CFD simulations. The system may be used as a flight simulator for pilot training in a realtime environment. The system may be used to support component testing using an interface to those components, such as flight electronics and actuators, to test the components in high fidelity simulations of actual flight demands on those components. The system may also be used to support design analysis in non-realtime to run numerous simulations on different designs and to provide comparative output.

7 Claims, 12 Drawing Sheets

(56) References Cited

U.S. PATENT DOCUMENTS

| | | |
|---|---|---|
| 10,134,299 B2 | 11/2018 | Zhang et al. |
| 10,296,672 B2 | 5/2019 | Rodriguez et al. |
| 10,502,755 B2 | 12/2019 | Berdoulat |
| 10,747,917 B1 | 8/2020 | Tardy |
| 2008/0095652 A1 | 4/2008 | Jiang |
| 2013/0096890 A1 | 4/2013 | Vanderheyden et al. |
| 2016/0376003 A1* | 12/2016 | Feldman ................ B64C 31/02 703/2 |
| 2018/0366011 A1 | 12/2018 | Thales |
| 2019/0088156 A1* | 3/2019 | Choi ...................... G09B 9/003 |
| 2019/0354657 A1 | 11/2019 | Placko et al. |
| 2020/0301971 A1* | 9/2020 | Skarica ................ B64C 39/024 |

FOREIGN PATENT DOCUMENTS

| | | | |
|---|---|---|---|
| WO | WO 2008/108881 A1 | 9/2008 | |
| WO | WO 2010/068780 A1 | 6/2010 | |
| WO | WO-2010068780 A1 * | 6/2010 | ............. B60L 8/006 |
| WO | WO 2013/134705 A1 | 9/2013 | |

* cited by examiner

METHOD AND SYSTEM FOR MODELING AERODYNAMIC INTERACTIONS IN COMPLEX EVTOL CONFIGURATIONS FOR REALTIME FLIGHT SIMULATIONS AND HARDWARE TESTING

CROSS-REFERENCE TO RELATED APPLICATIONS

This application claims benefit of U.S. Provisional Patent Application No. 62/925,957 to Mikic et al., filed Oct. 25, 2019, which is hereby incorporated by reference in its entirety.

BACKGROUND

Field of the Invention

This invention relates to flight simulation, and more specifically to a flight simulation system for complex eVTOL aircraft configurations.

Description of Related Art

Use of electronic motors has opened possibilities of incorporating units with airframes in ways that were often previously deemed impractical. Efficiency of electric propulsion units scales well with their size and their power to mass ratio is favorable; therefore distributing them and integrating them in novel and beneficial ways has opened the design space.

The increase in the number of lifting or propulsion units on an airframe leads to creation of complex aerodynamic configurations. In the eVTOL space, the complexity is compounded by the increased variety of aerodynamic flight regimes such aircraft find themselves in, from hover, transition, to cruise flight. There exist few methods that allow for good analysis of such configurations at the early stages of design, and fundamental problems may uncovered only after detailed CFD analysis or even only during actual flight testing. Often these problems are not due to just insufficient predictive capability but simply the fact that exploring the whole operational regime of such aircraft with sufficient analysis detail is a significant effort.

For eVTOL configurations, realtime simulation can be perceived not just as an analysis and development tool once the design is fairly defined, but can be used in early conceptual stages in order to get a good intuitive understanding of the concept as well as to check for controllability and performance. Traditionally, in order to obtain a good realtime simulation model one needs a fairly detailed analysis on a well defined geometry in order to calculate the aerodynamic data to be fed into the simulation. Furthermore, capturing the aerodynamic interactions for complex configurations with many different possible control actuation combinations creates a highly dimensional exploration space, especially if nonlinear effects are to be captured. There exist methods to decompose an aircraft down to the individual component level and then calculate component forces and moments and their flow interactions in order to describe aircraft dynamics. The interaction between aerodynamic components in such approaches is often simplistic and may not achieve the level of fidelity that is required to understand system behavior.

What is needed is a system for modeling aerodynamic interactions in complex configurations including eVTOL configurations. What is also needed is a system and method which has the capacity to resolve phenomena such as propeller wake to wing interactions, propeller wake to body interactions, propeller wake to tail interactions, and the effects of the aircraft structural components on propeller performance, especially during take-off and landing with a VTOL aircraft, and to do so with few underlying assumptions. What is also needed is such a modeling system which then can be coupled to a flight simulator for pilot training, and for system performance analysis, and which can be used to provide inputs to actual hardware in a virtual/real world combination component test environment.

SUMMARY

A method and system for modeling aerodynamic interactions in complex eVTOL configurations for realtime flight simulations and hardware testing which includes decomposing the aircraft into aerodynamic subcomponents, wherein the interactions between these components are handled by flow simulations of the surrounding fluid, which may be Euler flow CFD simulations. A computer generated simulation can be used to analyze the fluid flow and pressures, the forces delivered by an aircraft into the fluid and the forces onto the aircraft from the fluid, to determine the position and attitude of the aircraft, and other aspects. The system may be used as a flight simulator for pilot training in a realtime environment. The system may be used to support component testing using an interface to those components, such as flight electronics and actuators, to test the components in high fidelity simulations of actual flight demands on those components. The system may also be used to support design analysis in non-realtime to run numerous simulations on different designs and to provide comparative output.

DETAILED DESCRIPTION

Figure 1A:
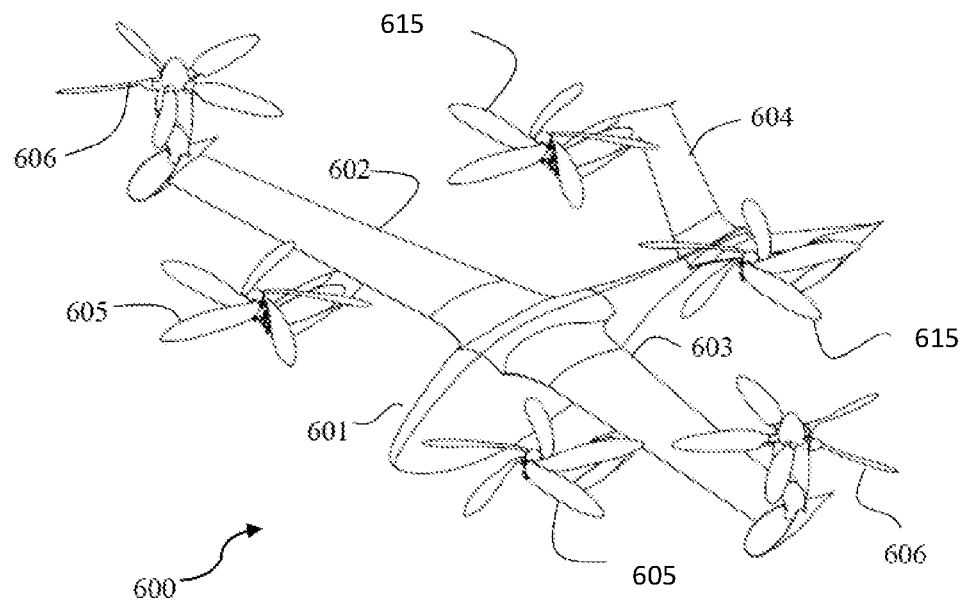
FIGS. 1A-C are views of an aerial vehicle which may be simulated according to some embodiments of the present invention.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented in hardware, in software (including firmware, resident software, micro-code, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RE, etc., or any suitable combination of the foregoing.

Computer program code for carrying out operations for aspects of the present disclosure may be written in any combination of one or more programming languages, including an object oriented programming language, such as JAVA®, SCALA®, SMALLTALK®, EIFFEL®, JADE®, EMERALD®, C++, C#, VB.NET, PYTHON® or the like, conventional procedural programming languages, such as the "C" programming language, VISUAL BASIC®, FORTRAN® 2003, Perl, COBOL 2002, PHP, ABAP®, dynamic programming languages such as PYTHON®, RUBY® and Groovy, or other programming languages such as Matlab/Simulink. The program code may execute entirely on the user's computer, partly on the user's computer, as a stand-alone software package, partly on the user's computer and partly on a remote computer or entirely on the remote computer or server. In some embodiments, the remote computer can be a bench test computer. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatuses (systems) and computer program products according to aspects of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

In some embodiments of the present invention, a realtime interactive simulation system of aircraft flight which models aerodynamic interactions, for example, of an eVTOL aircraft during hover, transition, and in forward flight. In some aspects, the simulation system supports a flight simulator which may be used for pilot training. In some aspects, the simulation system supports a larger system used to test real world components which are coupled to the simulation system in realtime, and using a high fidelity representation of actual flight demands. In some aspects, the simulation system is used to test real world components, while also supplying load information for the tested components, which is then externally applied onto to those components to provide a high fidelity representation of actual flight demands. The system may also be used to support design analysis in non-realtime to run numerous simulations on different designs and to provide comparative output.

In some aspects, the simulation system utilizes a background incompressible Euler flow solver, wherein the entire computational volume is considered to be filled with fluid and the aerodynamic elements of the aircraft interact with it as force density sources. In some aspects, the flow volume is defined with respect to the aircraft coordinate frame, such that the flow volume translates and rotates with the aircraft. This may achieved by creating a fluid flow mesh in a first coordinate frame, and then representing the aircraft in a second coordinate frame, and then fixedly coupling the first and second coordinate systems. This provides challenges with boundary conditions and updates of the internal velocity fields when the aircraft velocity and angular velocity change. One may define the induced velocity u', which is defined as the deviation of flow velocity from the freestream incoming air, obtained from the aircraft relative velocity field u through $$u = -(v + \omega \times r) + u',$$

where v is velocity and ω is the angular velocity of the aircraft with respect to the chosen aircraft rotation origin, with r the distance from that origin. This gives the far freestream boundary condition $\mu'|_{freestream} = 0$ for the incoming flow, and therefore the freestream inlet induced velocity flow field is invariant with respect to aircraft maneuvers.

The simulation system may be used for realtime simulations, as with a flight simulator, or when coupled to real-world components for testing. The simulation system may be used for non-realtime simulation runs, creating data output which may allow for comparison of different designs which are evaluated under flight simulation conditions, allowing for the evaluation of varied designs in a short time.

Figure 1B:
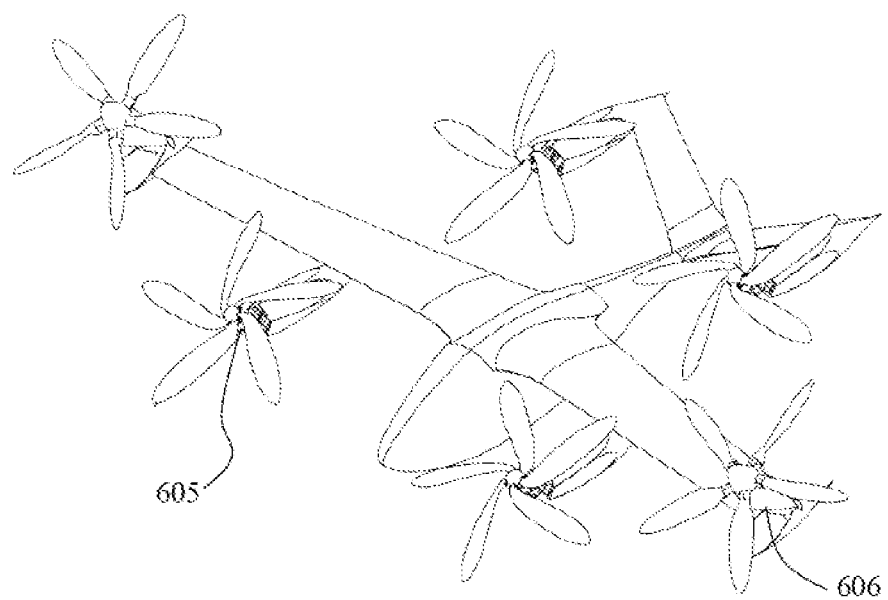
Figure 1C:
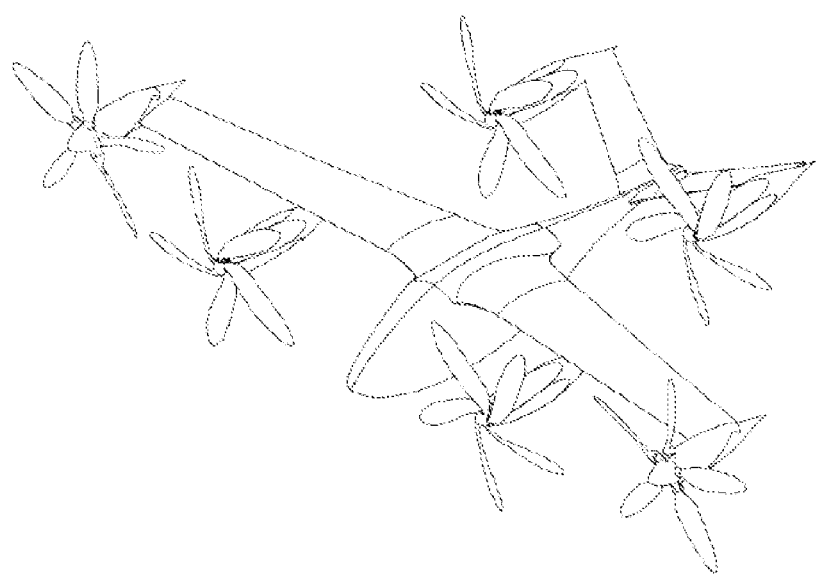

The simulation system may be utilized in conjunction with numerous and varied aircraft design types, and the aircraft types described below are used as illustrative examples. FIGS. 1A-C illustrate an aerial vehicle 600 during take-off and through transition to forward flight according to some embodiments of the present invention. In this illustrative embodiment, the aerial vehicle 600 has a body 601, wings 602, 603, and a tail structure 604. The motor driven rotor assemblies 605 along the midspan of the wing, and rear rotors 615 attached to the tail structure, have articulating mechanisms adapted to deploy the rotor assemblies. This allows for vertical thrust for take-off and landing, as seen in FIG. 1A. The wing tip rotor assemblies 606 are adapted to pivot to a vertical thrust orientation as well.

After take-off, the rotor assemblies 605, 606, 615 are adapted to transition towards a forward flight configuration, with the thrust moving from a vertical orientation towards a horizontal orientation, via motion of the rotor assemblies, as seen in FIG. 1B. At transition to forward flight, as seen in FIG. 1C, the rotor assemblies 605, 606, 615 have fully transitioned to a horizontal thrust position.

During hover, as seen in FIG. 1A, each of the rotor assemblies will provide downward force onto the fluid (air), and will also provide a rotational force component. Portions of the air flowing through the propellers of the rotor assemblies will then impinge upon the wings, the aircraft body, and the tail structure, imparting load onto those components. Similarly, there will be both a vertical force and a counter-rotational moment imparted onto the rotor assemblies.

A CFD simulation module that ignores viscous effects may also be called an inviscid CFD simulation module. The equation below provides an exemplary field equation for an inviscid CFD simulation module. The equation, also called the Euler method, represents the conservation of mass, conservation of three components of momentum, and conservation of energy:

$$\frac{\delta m}{\delta t} + \frac{\delta f_x}{\delta x} + \frac{\delta f_y}{\delta y} + \frac{\delta f_z}{\delta z}, \text{ where:}$$

$$m = \begin{pmatrix} p \\ \rho u \\ \rho v \\ \rho w \\ E \end{pmatrix}; f_x = \begin{pmatrix} \rho u \\ p + \rho u^2 \\ \rho uv \\ \rho uw \\ u(E+p) \end{pmatrix}; f_y = \begin{pmatrix} \rho v \\ \rho uv \\ p + \rho v^2 \\ \rho vw \\ v(E+p) \end{pmatrix}; f_z = \begin{pmatrix} \rho w \\ \rho uw \\ \rho vw \\ p + \rho w^2 \\ w(E+p) \end{pmatrix}$$

Figure 2:
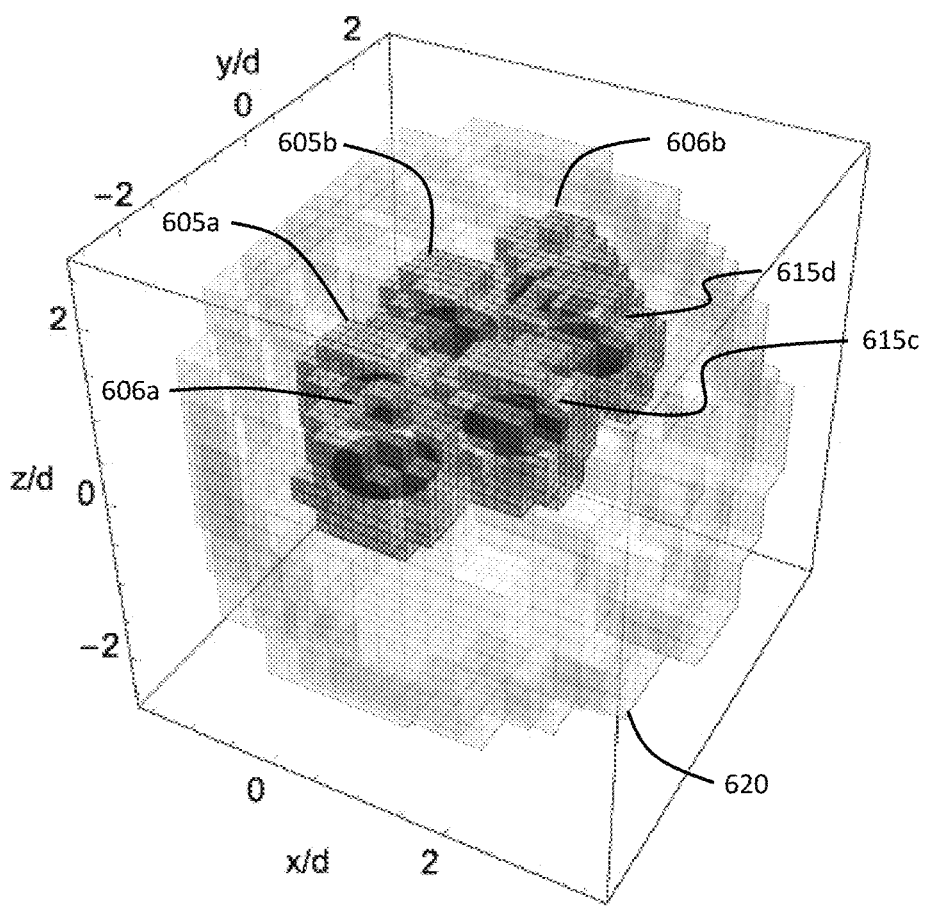
FIG. 2 is a perspective view of an octree based multigrid mesh built around an aircraft, with rotor discs in hover configuration shown, according to some embodiments of the present invention.

In this illustrative example, the underlying mesh for the flow solver is a Cartesian mesh based on octree subdivision of cubic voxels, with a starting voxel that may be many wingspans across. This allows for good mesh refinement in areas near aerodynamic force generators, such as wing sections and propellers or rotors. An illustrative example of such a mesh is seen in FIG. 2. The wing tip rotors 606 have their refined meshes 606a, 606b, as the mid span wing rotors have their refined meshes 605a, 605b. The rear rotors have their refined meshes 615a, 615b. As discussed above, the flow volume is defined with respect to the airframe. Although further refined mesh areas are not used in this illustrative example, there could be such areas if desired. A volume 620 further out from the refined mesh areas may include voxels of larger size.

In an illustrative example of an aircraft 600, the aircraft may have a wingspan of 10.7 meters, and a mean aerodynamic chord of 1.1 meters. The rotor propellers may have a radius of 1.5 meters, and the aircraft may be 6.5 meters long.

The pressure equation is solved in a multigrid manner, which is a method easily adaptable to the octree mesh. The advection used is a combination of the upwind scheme for low local Courant numbers, which is linearly interpolated towards a direct velocity field lookup scheme as the Courant number increases. Advection is calculated with respect to the complete velocity field u. The advected induced velocity field ũ is then also rotated by $$\dot{\tilde{u}} = -\omega \times \tilde{u}$$

to account for airframe rotation.

In the case of the aircraft described above, the computational volume used for fluid dynamic analysis may be sized by using dimensions greater than twice the aircraft dimension in each axis. In some aspects, the computational volume is 5-10 times the aircraft dimension in each axis. In some aspects, the computational volume is greater than 10 times the aircraft dimension in each axis. The refined mesh areas may have cubic areas of 10 cm dimension, for example. As described above, the fluid flow mesh is fixedly coupled to the aircraft reference frame and the aircraft representation. In some aspects, some of the aircraft itself may change orientation relative to other parts of the aircraft, such as when rotors tilt during transition on a VTOL aircraft as described above. In such a circumstance, it is understood that a selected portion of the aircraft shall be the portion which is fixedly coupled to the coordinate frame of the fluid flow mesh.

Aircraft wings and other lifting surfaces are modeled as a composition of independent lifting elements. For each element slice, the incoming wind velocity is calculated at its quarter chord, or other appropriate longitudinal location. From this wind velocity, a 2D airfoil lookup table is generated to calculate the lifting element force. Should the longitudinal lifting element slice also have a control surface, such as an aileron, the lookup table can contain information about the lift based upon that control surface's position, and can account for Reynolds and Mach number, assuming subsonic flight. After the lifting element force is calculated for each longitudinal element slice, it is distributed across a sphere of a size that will correspond to a chosen dimension of that element slice, which may be its chord length, for example. The distribution may be necessary to in order to avoid spatial instabilities that may arise when applying a discrete force to just a single computational cell of the fluid model. As the force for a single element is transmitted to the fluid volume via a sphere whose size is a function of the airfoil slice length, or other characteristic dimension or parameter, and that each element slice will have its own sphere, the adjacent spheres will overlap. The overlap is actually desirable, as this may reconstruct a representation of a continuous surface that was previously deconstructed to make elements slices. This allows for the element slices to form a unified lifting surface. This approach captures wing-tip vortex effects without further prescriptions. The width of each longitudinal slice may be 0.5 meters, for example, in the case of the aircraft introduced above. In some aspects, the slice width may be narrower or wider.

As much of the complexity of eVTOL centers on the rotors and propellers, it is these elements which may form the core of the solution method. Realtime simulations may use the actuator disc model, while for offline simulations, or large propellers, enhancement may be achieved by resolving individual blade dynamics. First, the velocity in the propeller plane is calculated by sampling the velocity field with sufficient resolution within the propeller disc, for example with more than six points. A polynomial fit in the propeller plane, which can be linear, quadratic, or of a higher order, or could be a fit to a set of basis functions other than polynomial, is performed to calculate the approximation of the velocity inflow function. Using this inflow information, forces and moments are calculated for different azimuthal and radial stations of the actuator disc using airfoil lookup tables. From these elements, an overall force and moment for the propeller is obtained. The overall moment may be a composite of a shaft moment, the rolling moment, and the pitch moment.

Figure 3:
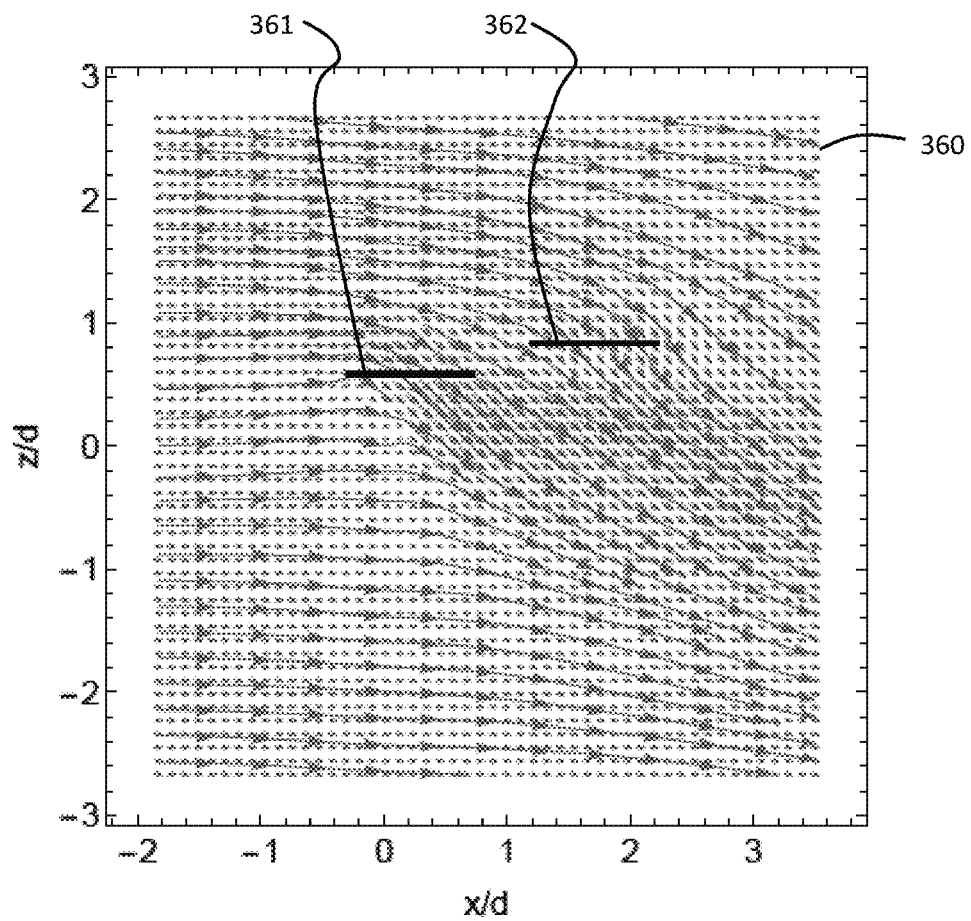
FIG. 3 is a view of a cut through the propeller plane according to some embodiments of the present invention.

Forces are then applied to a cylinder extruded from the propeller disc plane down at least a few local cells in order to avoid instabilities. The overall aerodynamic moment exerted by the propeller disc on the fluid is represented by a linear vector force density function in the plane of the propeller such that the integral of the moment over the propeller disc is equal to the total propeller moment. This approach captures both the swirl of the propeller wakes as well as differences in downwash velocities for advancing and retreating portions of the propellers in edgewise flight. Ground effects can be captured by defining a ground plane and finding a force density such that for the volume cells beneath that plane the velocity normal to the plane is zero. An example of the resolved complexity of interactions is seen in FIG. 3. The resolved flow field 360 illustrates the fluid flow, including through the two illustrated rotors 361, 362.

Using the simulation system as described above, many significant interactions will be captured, including downwash from rotors or propeller slipstreams onto other aerodynamic elements, including drag of wings, vortices due to propeller lift, unevenness of propeller downwash in edgewise flight, and ground effects. Also, the effects of the aircraft and its aerodynamic elements onto propeller performance is taken into account, as well as the effects of other propeller wakes on propeller performance. In addition, these many interactions are able to simulated for eVTOL aircraft with many rotors during vertical take-off and landing, transition to and from forward flight, and during forward flight. Also, this interactive simulation system allows for the simulation of various types of failures, including rotor failures, with sufficient fidelity to resolve interactions based on physical flow and not based upon simplified formulas.

Further, these interactions may be simulated in real time to provide a flight simulation responding to a test pilot operating a flight simulator, with the computational results being utilized to provide a high fidelity flight simulation for the pilot. The modeled interactions also provide high fidelity load solutions on the aircraft itself, allowing for the analysis of the aircraft design with regard to stress and other factors. With the realtime determination of the loads, such as the loads on a tilt actuator for an articulating VTOL rotor, these realtime loads can be used to test the tilt actuators while externally loading them in realtime with the loads as would be seen in actual flight. Although illustrated herein using the example of the aircraft as seen in FIGS. 1A-C, it is understood that the system and method could be used across a variety of aircraft designs. The system may also be used to support design analysis in non-realtime to run numerous simulations on different designs and to provide comparative output. Non-realtime simulations may be run at high speed, in order to allow for a quicker analytic determination, or may be run slower than realtime, which may allow for increased fidelity, for example. Aircraft flight inputs may be user supplied at a flight simulation console, for example, or the inputs may be supplied by an automated system.

Figure 4:
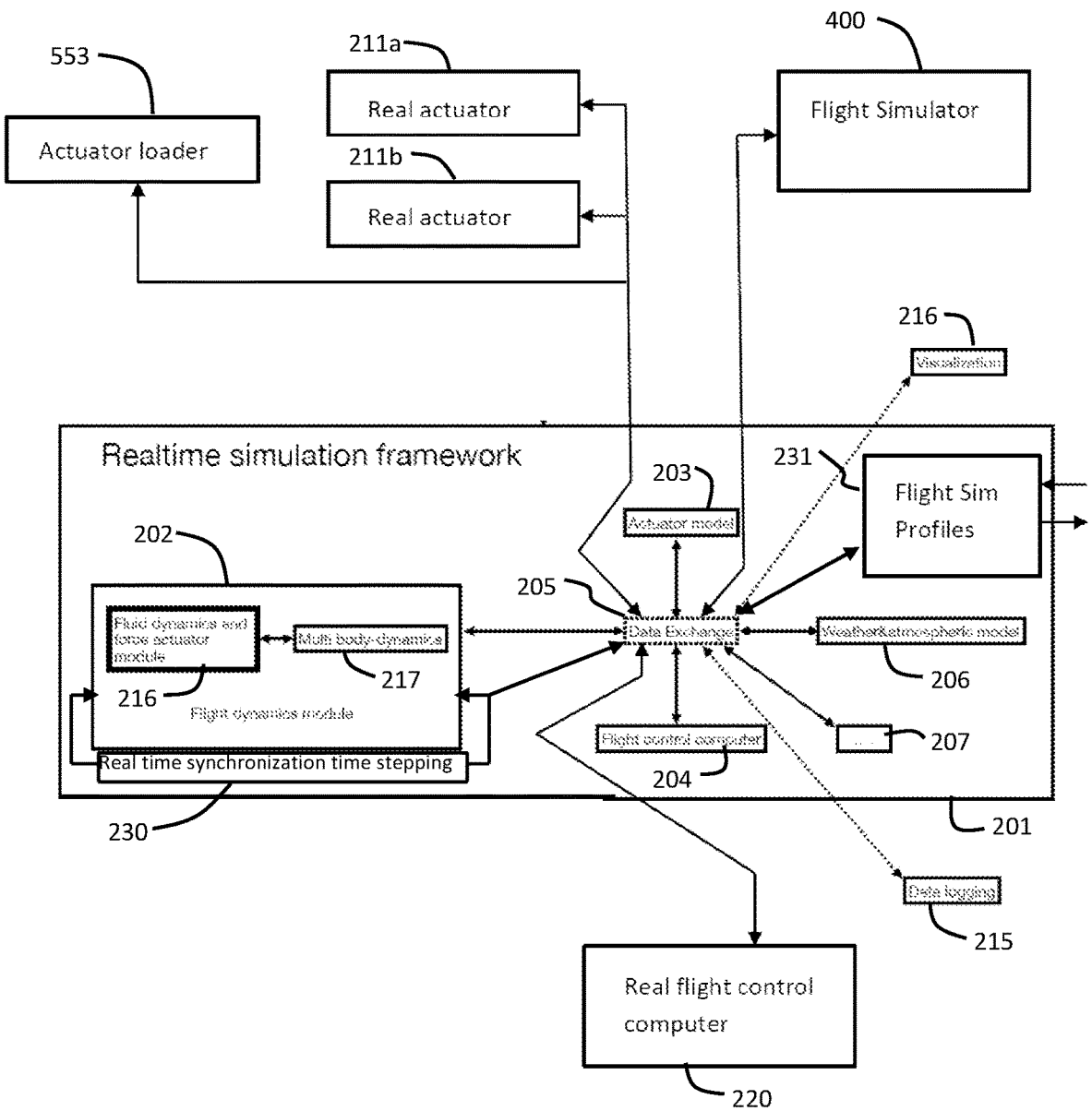
FIG. 4 is a diagram of a simulation system coupled to real world components according to some embodiments of the present invention.

FIG. 4 illustrates aspects of the overall system configurations according to some embodiments of the present invention. A realtime simulation framework portion 201 includes a fluid dynamics and force actuator module 216 and a multi body-dynamics module 217. The fluid dynamics and force actuator module 216 includes the modeling of the flow volume and underlying mesh of the computation volume. The multi body-dynamics module 217 takes forces as input, which can then determine the motion and the attitude changes of the aircraft and its articulated components such as acutators, as well as all other forces and moments onto the aircraft. The forces imparted by the aircraft into the fluid are transmitted to the fluid dynamics and force actuator module 216, which then resolves the flow and forces within the computational volume. The calculations undertaken by the fluid dynamics and force actuator module 216 and those undertaken by the multi body-dynamics module 217 may include cross-communication between the two modules in support of each module's calculations.

The flight dynamics module 202 is coupled to a data exchange module 205, which may both provide inputs into the flight dynamics module, and receive output from the flight dynamics module. In order to provide a high fidelity simulation of an aerial vehicle, the flight control computer of the aerial vehicle is simulated with a flight control computer module 204. The tilt actuators of the VTOL aircraft are simulated in an actuator module 203. The flight control computer of the aircraft of the VTOL aircraft is simulated in a flight control computer module 204. The weather and other atmospheric conditions are simulated in the weather and atmospheric model module 206. Simulated flight profiles may be held in a flight profiles module 231.

Figure 5:
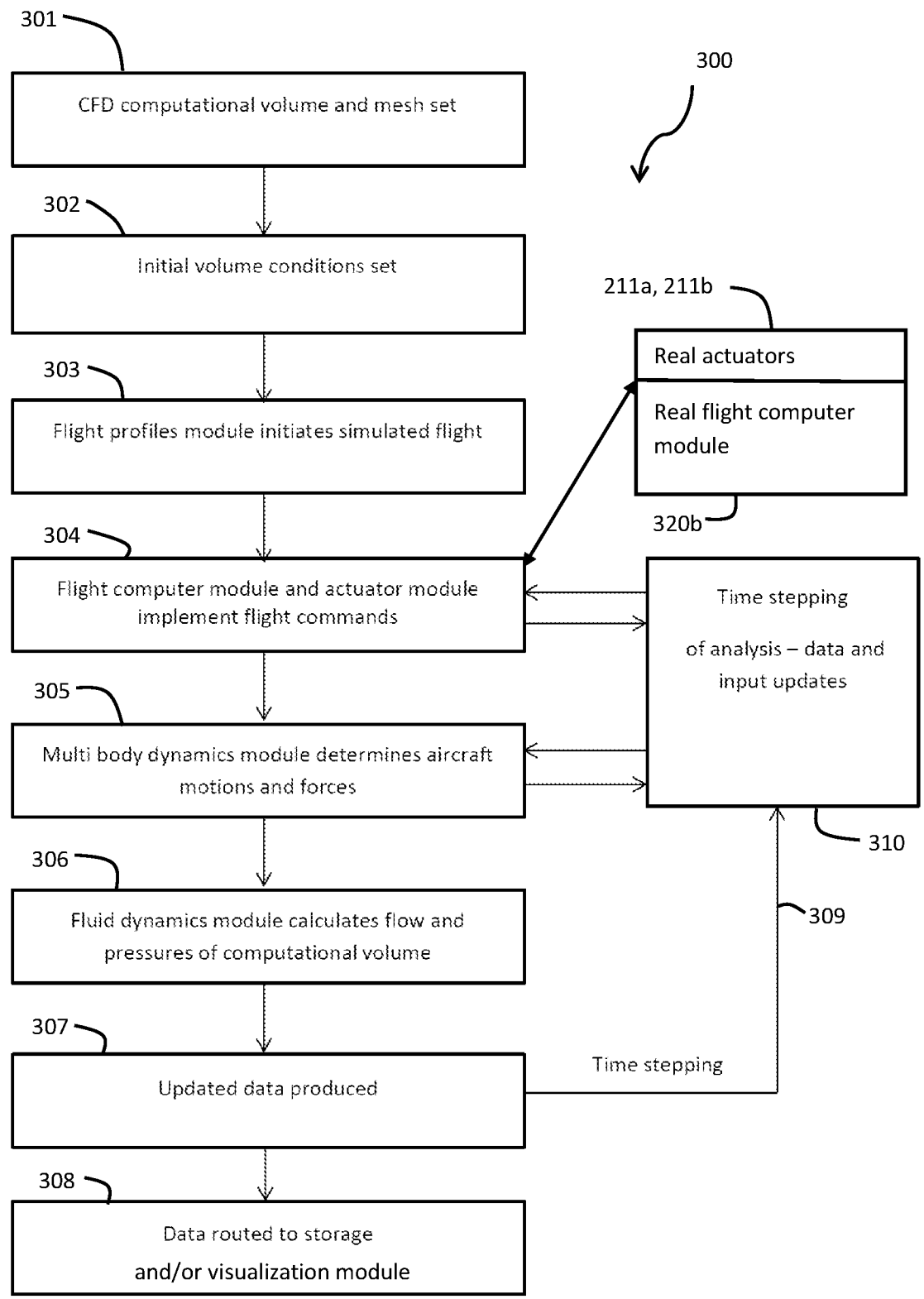
FIG. 5 is a flow chart of an analytical simulation according to some embodiments of the present invention.

In an exemplary method 300 of steps according to some embodiments of the present invention, as seen in FIG. 5, using all or part of the system of FIG. 4 as an analytical tool of an aircraft flying a flight profile, a user may initiate a scripted flight. The flight is of an aircraft which has a CFD mesh prepared, which is defined with respect to, and fixedly coupled to, the aircraft coordinate frame, and has the computational volume set 301. An initial conditions set of fluid flow and pressure may be set 302 for the computational volume used. The flight profiles module 231 may then input 303 simulated pilot commands into the data exchange module 205, which may send and receive information and commands in a manner which itself simulates the data transfer bus on the real life aircraft. This flight command input may then be routed to the flight control computer module 204, which implements the input, and is also routed to the actuator module 203, which also implements the input 304. For example, the commands may initiate the take-off of the aircraft from the ground by spinning up the rotors. In the case of a fully virtual simulation, virtual actuators represented by the actuator module 203 are used. In the case wherein real world actuators 211a, 211b may be used, as in the case of component characterization and testing, the real world actuator or actuators are engaged, as discussed further below. In the case wherein a real world flight computer 320b may be used, as in the case of component characterization and testing, a physical flight computer is used, as discussed further below. The forces are sent to the multi body-dynamics module 217, which can then determine the change in aircraft attitude, position, and altitude based upon the effect of the calculated forces on the aircraft 305. Also, the forces onto the aircraft components are calculated. The aerodynamic forces are a result of the interaction between the multi body dynamics module and the fluid dynamics module. The forces imparted onto the simulated fluid by the rotors will then be utilized by the fluid dynamics module 216, which then resolves 306 the flow and forces within the computational volume. A full data set related to all parameters has been created 307. All of this information regarding the aircraft 308 may be stored in the data logging module 215, or may be visually represented in the visualization module 216.

The produced data is routed 309 to be utilized 310 in the next time step analysis. For each time step, the forces are updated into the multi body dynamics module 217, including consideration of the changes in actuator power levels and tilt angles as inputted by the flight profile module 231. All updates related to the time step may be synchronized by the time stepping module 230, which may interact with all portions of the realtime simulation framework 231, either through the date exchange module 205, or directly (not shown for clarity). The forces imparted onto the simulated fluid by the rotors will then be utilized by the fluid dynamics module 216, which then again resolves 306 the flow and forces within the computational volume. This repeated set of steps allows for detailed analysis of the parameters as the flight simulation progresses with continual updates of the induced velocity, the advection, and other parameters. With this system, the flight command inputs and their resultant forces onto the fluid and flow of the fluid, the forces within the mesh, the resultant forces on the aircraft, and then the changes in aircraft position, speed, and altitude, are all calculated for each time step in a comprehensive integrated fashion. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

In some aspects, non-realtime simulations are run as discussed above, with the output data provided to a memory storage device. In some aspects, one or more aircraft parameters are altered and the non-realtime simulation is run again, with the output data provided to a memory storage device. The repetition of simulations with altered aircraft parameters allows for the comparison of the output for the altered aircraft. In some aspects, the output data is tabulated and displayed to allow for comparative evaluation of the aircraft with the varied parameter values. In some aspects, the output data is graphically represented in two or more dimensions on a display screen, allowing for visual comparison of data. The evaluative non-realtime simulations may be run at accelerated speed relative to realtime, allowing for quick derivation of comparative results. In some aspects, the non-realtime simulations may be run at a slower speed than realtime, as may be desired to support higher resolution.

As seen in FIG. 4, a realtime simulation framework 231 may include the parts of the overall system, which may viewed as the application software portions of the system. As discussed below with regard to FIG. 10, computerized aspects of the system 500 may include one or more processors, memory, operating system(s), and application software. In some aspects, portions of the system outside of the realtime simulation framework 231 may also include their own computerized aspects with similar components, such as a flight simulator console, or a graphical display output portion.

Figure 10:
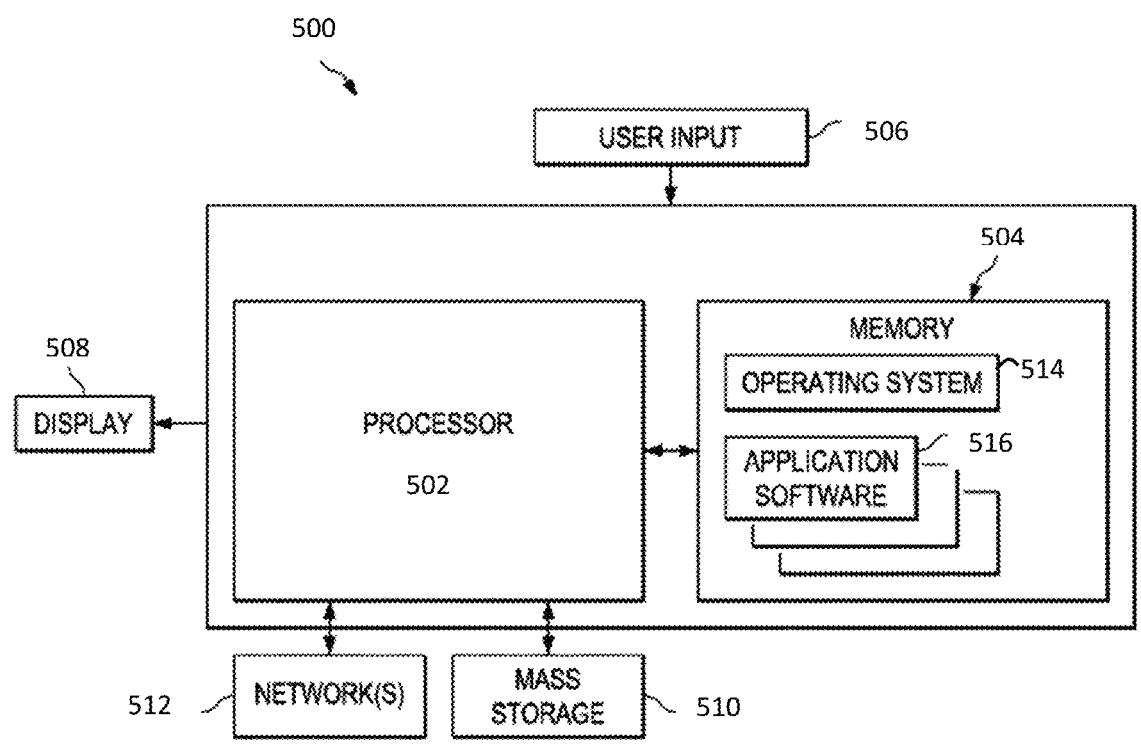
FIG. 10 is a diagram of a hardware setup according to some embodiments of the present invention.

FIG. 10 is an example of hardware setup 500 that may be used to implement aspects of the embodiments described herein. The hardware setup typically includes at least one processor 502 coupled to a memory 504. The processor 502 may represent one or more processors (e.g., microprocessors), and the memory 504 may represent random access memory (RAM) devices including a main storage of the hardware setup, as well as any supplemental levels of memory, e.g., cache memories, non-volatile or back-up memories (e.g., programmable or flash memories), read-only memories, etc. In addition, the memory 504 may be considered to include memory storage physically located elsewhere in the hardware 500, e.g., any cache memory in the processor 502, as well as any storage capacity used as a virtual memory, e.g., as stored on a mass storage device 510.

The hardware setup 500 also typically receives a number of inputs and outputs for communicating information, as discussed above. For interface with a user or operator, the hardware setup may include one or more user input devices 506 (e.g., a keyboard, a mouse, etc.) and a display 508 (e.g., a cathode ray tube monitor, a liquid crystal display panel). An embodiment provides that local copies of the alias database can reside on a remote computer and accessed by multiple users via a network.

For additional storage, the hardware 500 may include one or more mass storage devices 510, e.g., a floppy or other removable disk drive, a hard disk drive, a Digital Versatile Disk (DVD) drive, etc.) and/or a tape drive, among others. Furthermore, the hardware 500 may include an interface with one or more networks 512 (e.g., a local area network (LAN), a wide area network (WAN), a wireless network, and/or the Internet among others) to permit the communication of information with other computers coupled to the networks. It should be appreciated that the hardware 500 typically includes suitable analog and/or digital interfaces between the processor 502 and each of the components 504, 506, 508, and 512 as is well known in the art.

The hardware 500 operates under the control of an operating system 514, and executes various computer software applications 516, components, programs, objects, modules, etc. (e.g., a program or module which performs operations and functions as described above). In an illustrative example, the realtime simulation framework 201, as seen if FIG. 4, would be viewed as the software application 516. Moreover, various applications, components, programs, objects, etc., may also execute on one or more processors in another computer coupled to the hardware 500 via a network 512, e.g., in a distributed computing environment, whereby processing required to implement the functions of a computer program may be allocated to multiple computers over a network.

Figure 6:
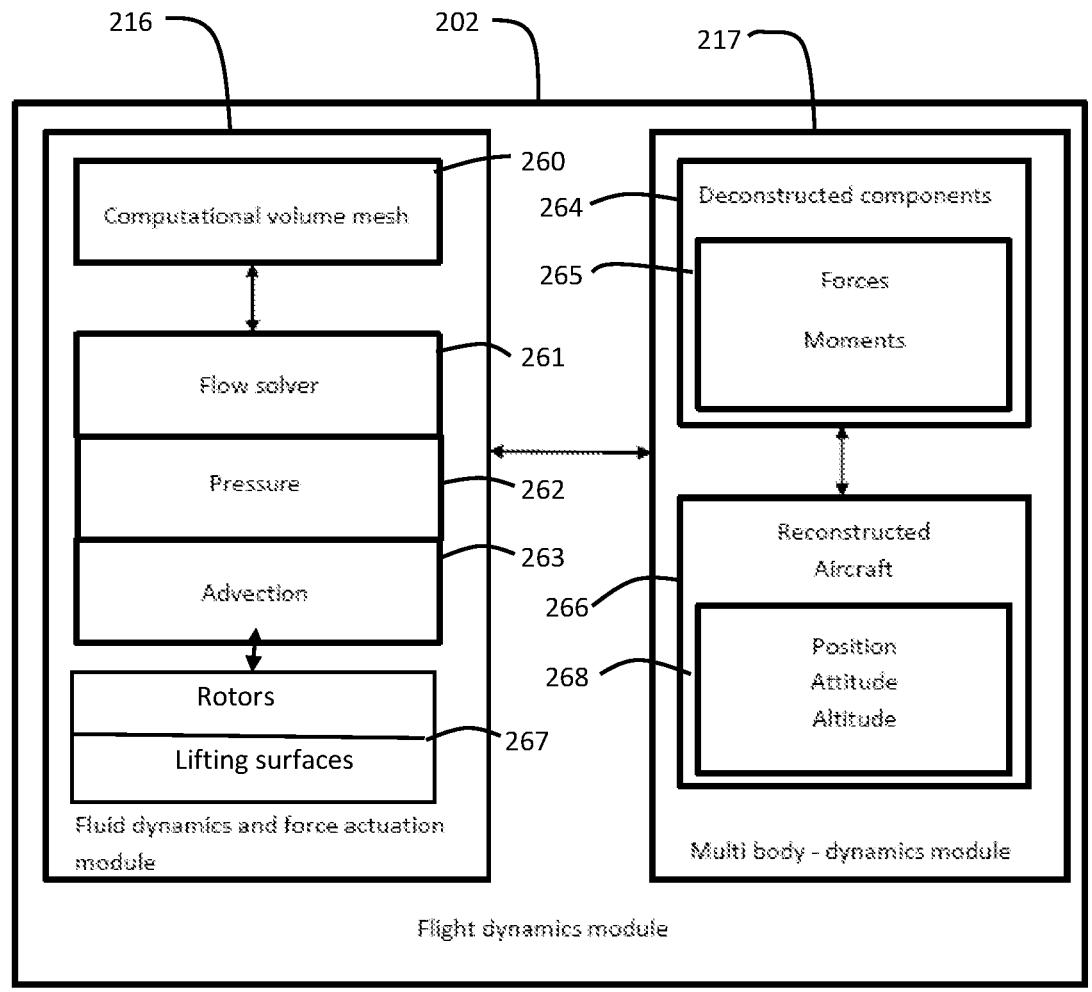
FIG. 6 is a diagram of a flight dynamics module according to some embodiments of the present invention.

FIG. 6 illustrates the flight dynamics module 202 according to some embodiments of the present invention. The fluid dynamics and force actuation module 216 and the multi body-dynamics module will interchange information during computation and simulation. The fluid dynamics and force actuation module 216 may include the computational mesh 260, and the flow solver 261 which may manage and update pressure 262 and advection 263. The force actuation aspects of the rotors and lifting surfaces 267 are utilized by the flow solver 261 during simulations. The multi body-dynamics module 217 may include aspects of the forces and moments 265 on components and deconstructed components 264, and also will solve for the position, attitude, and altitude 268 of the aircraft 266 relative to a ground reference frame coordinate system, or a wind reference frame coordinate system, or both.

Figure 7:
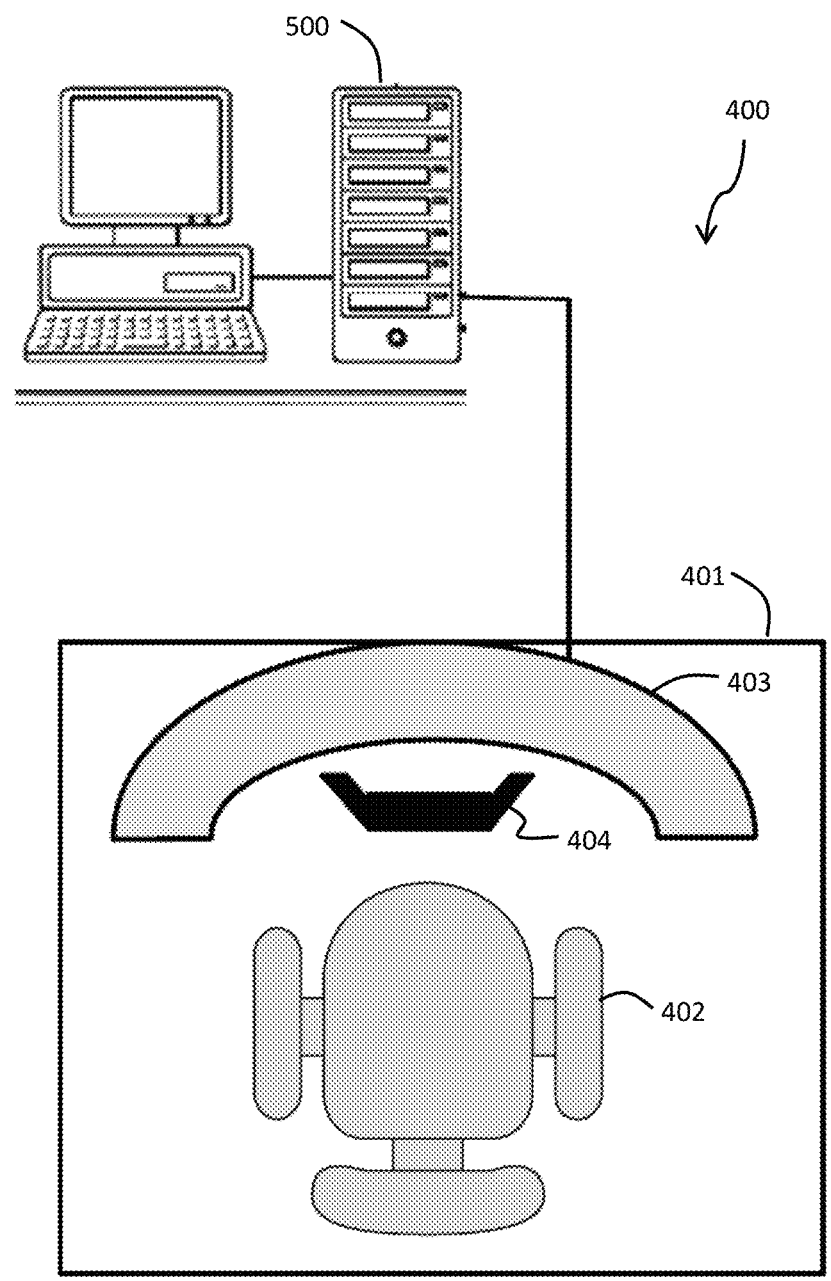
FIG. 7 is a diagram of a flight simulator according to some embodiments of the present invention.

In some embodiments of the present invention, as seen in FIG. 7, a flight simulator system 400 is seen which is used in conjunction with the aerodynamic interaction simulation portions 500 described above. In some aspects, a user will sit in a seat 402 in front of a screen 403, and will control a simulated aircraft flight using the flight controls 404. As discussed above, in some aspects the hardware setup includes a data exchange portion 205 which may route information transfer between the virtual flight control computer 204 and the flight commands of the user, from the flight controls 404, using the same information transfer protocols as seen on the real world aircraft. In some aspects, the flight controls may be a plurality of controls as would be seen in a eVTOL aircraft. In some aspects, the controls may have different operational modes for take-off and landing as compared to forward flight. In an exemplary embodiment of the flight simulator, a pilot may begin a flight on the ground and begin by initiating a vertical take-off. This take-off initiation may be implemented by using the appropriate control devices in the simulator 401, such as the movement of a control stick, or through other means. The command will begin the increase in rotor thrust, with the rotors tilted vertically. The force created by the increased thrust will then become part of the analysis and simulation as discussed with regard to FIGS. 4 and 5 above. The flight simulator 401 may receive position data from the hardware system 500 and display the view from that position to the pilot on the screen 403. In some aspects, the take-off functionalities of the aircraft will include auto leveling as the aircraft takes off, with the pilot controlling only altitude. In this circumstance, the virtual flight control computer will command the virtual actuators and the realtime simulation framework will control the aircraft, as needed, in order to lift off the aircraft as per the user's command. In some aspects, a weather baseline may have been entered, which may include winds which are included into the realtime simulation framework's calculations. The user may observe, via the flight simulator screen 403, a perspective similar to a real world piloting experience. Also, the pilot may experience controlling the aircraft in a high fidelity simulation environment. In some aspects, during forward flight the user/pilot may engage in flight maneuvers by using the controls 404. These control commands are routed to the virtual data exchange portion 205 and on to the virtual flight control computer 204, which then commands the virtual actuators 203. For each time step of the simulation, the flight dynamics module ascertains the aircraft behavior and determines the loads on the aircraft as well.

Figure 11:
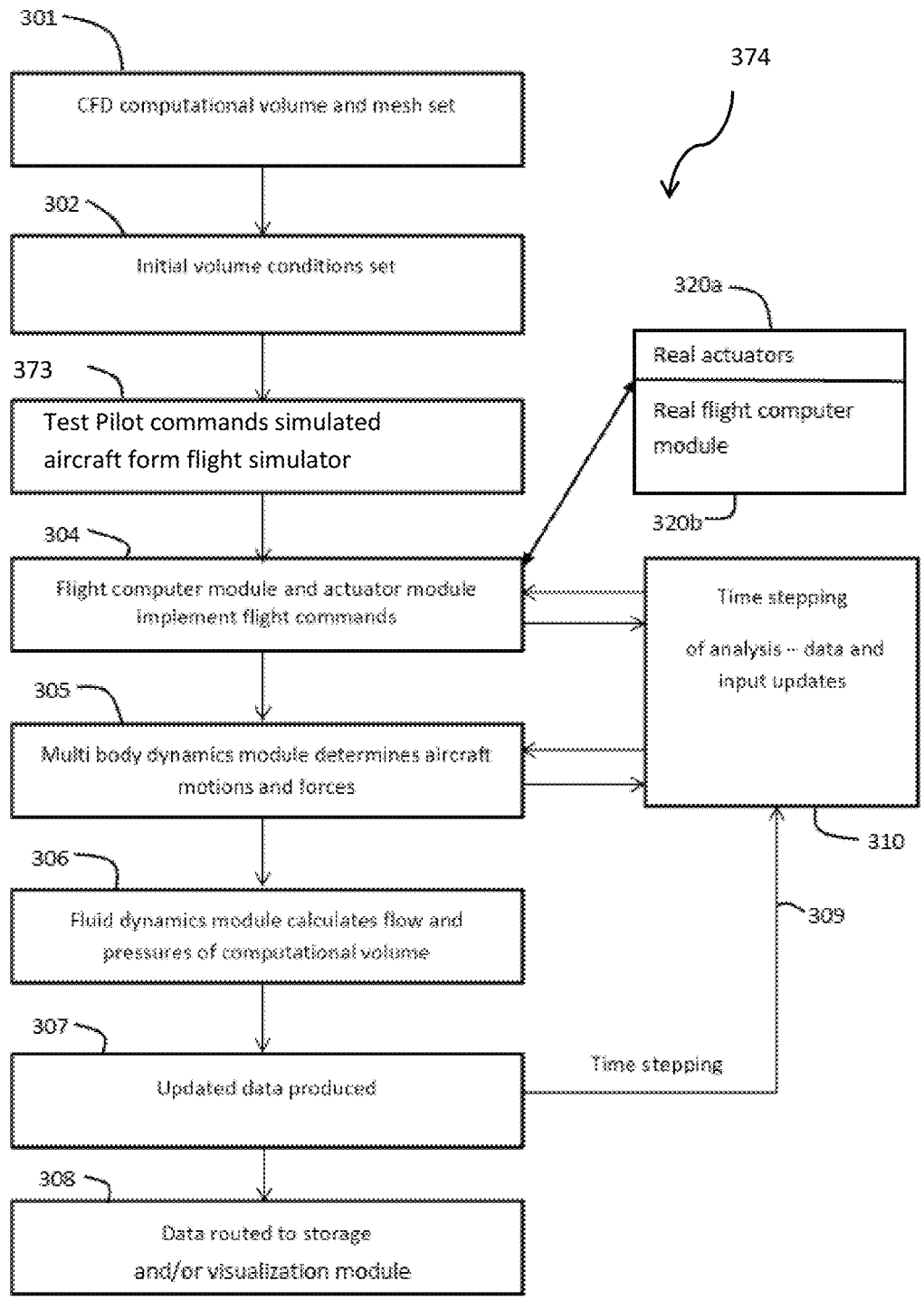
FIG. 11 is a flow chart of an analytical simulation according to some embodiments of the present invention.

FIG. 11 is a flow chart of the method steps which may implement the operation of the system as seen in FIG. 7. Instead of receiving commands from a scripted flight plan, the test pilot gives commands 373 using flight controls 404. The location and the attitude of the aircraft relative to the ground reference frame coordinate system is used to compose a view for the pilot on the screen 403.

Figure 8:
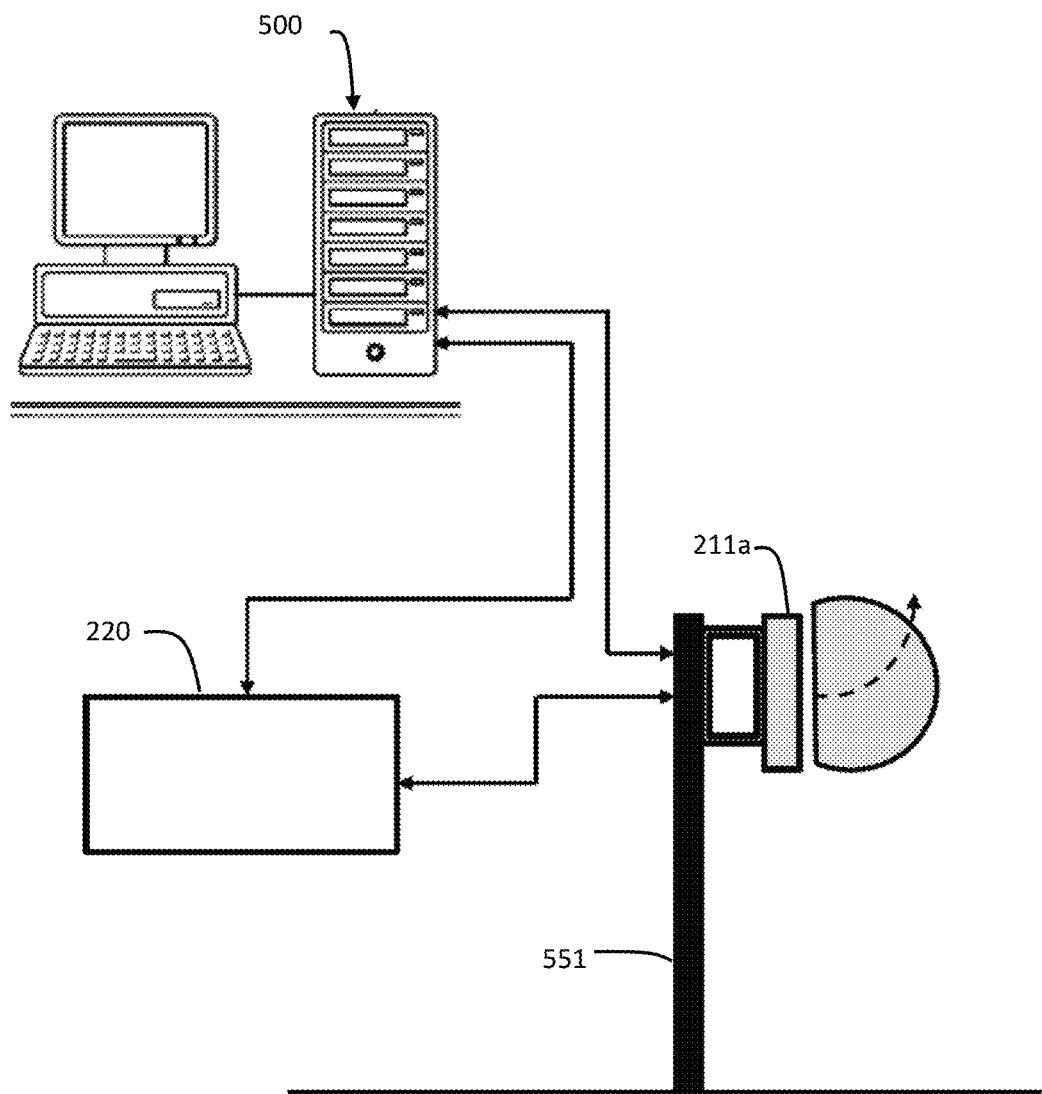
FIG. 8 is a diagram of a component test system according to some embodiments of the present invention.

In some embodiments of the present invention, as seen in FIG. 8, a system for component testing and interaction in realtime allows for the use of real world physical components in conjunction with the aerodynamic interaction simulation portions described above. In some aspects, a tilt actuator 211a for an eVTOL aircraft is coupled to a test stand 551. The tilt actuator comprises a tilt mechanism adapted to move the outboard portion of the actuator from a horizontal configuration to a vertical configuration, as would be seen during transitions from vertical flight to horizontal flight, and vice versa. In some aspects, the hardware setup 500 is electronically coupled to the actuator 211a. Although illustrated herein with a single actuator, a plurality of actuators could be included. Actuators other than rotor tilt actuators, such as control surface actuators, may be also tested as discussed herein. As discussed above, in some aspects the hardware setup includes a data exchange portion 205 which may route information transfer between the virtual flight control computer 204 and the virtual actuator model 203 using the same information transfer protocols as seen on the real world aircraft. In such a case, the actuator 211a in the test system of FIG. 8 may receive commands from the virtual flight control computer using a realistic information transfer protocol. In some aspects, a real world flight control computer 220 may also be tested along with the real world actuator or actuators. In some aspects, a real world flight control computer 220 may be tested without also using the real world actuator(s) to support the test.

Figure 9:
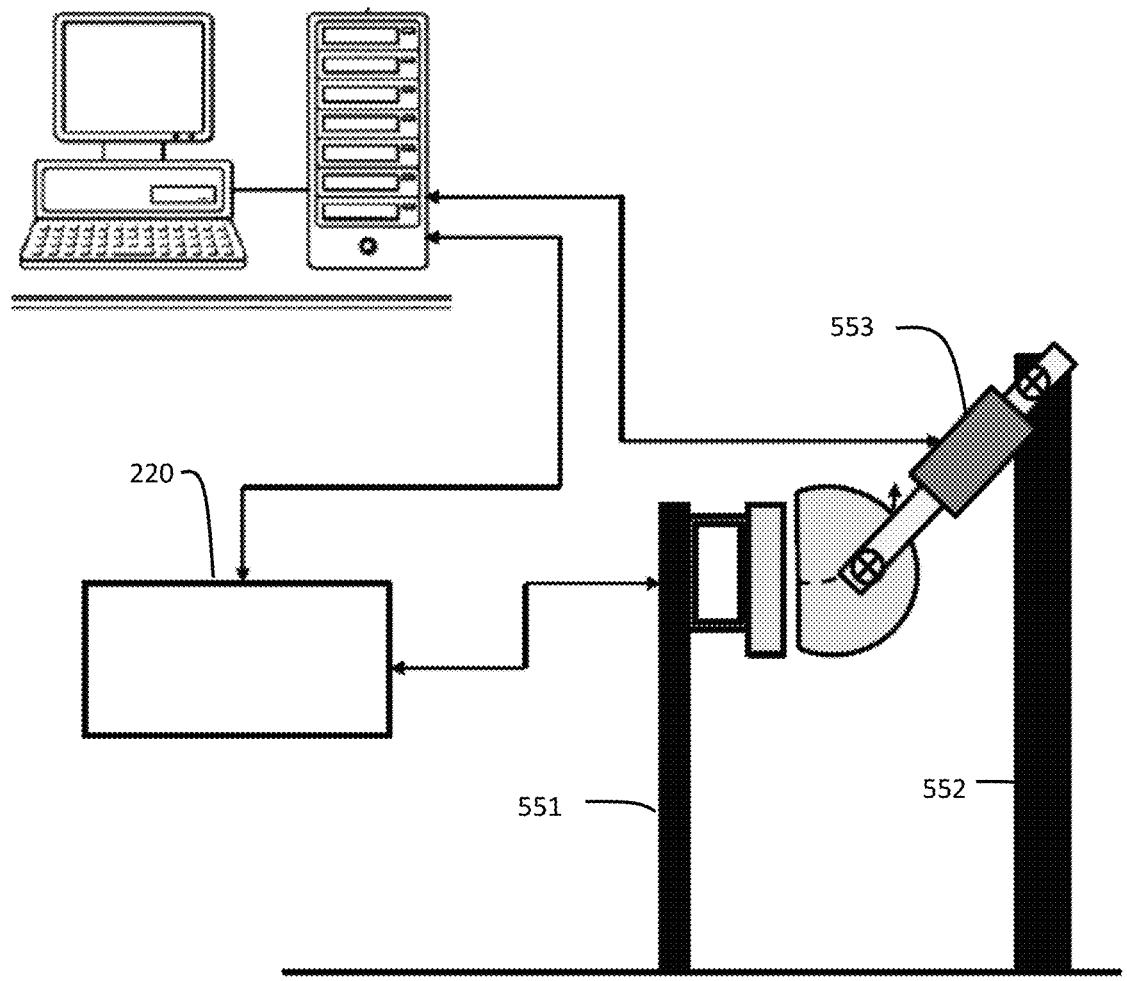
FIG. 9 is a diagram of a component test system with applied forces according to some embodiments of the present invention.

FIG. 9 illustrates a system for component testing and interaction in realtime which allows for the use of real world physical components in conjunction with the aerodynamic interaction simulation portions, and which also inputs loads into the tested real world components as have been determined in real time as the flight simulation progresses. A loading mechanism 553 is supported by a test stand 552. The loading mechanism 553 is coupled to the hardware setup 500. In an exemplary embodiment, as the flight simulation is run, actual loads that would be present onto the rotor tilt mechanisms are determined as part of the flight simulation analysis. This load is then delivered to the actuator (s) via a loading mechanism 553. For example, when under full hover thrust during a takeoff, there may be significant resistance to the tilt mechanism as it seeks to move away from the vertical orientation. The analytically determined loads from the computational modules can be supplied in real time to the real world actuator(s) being tested. Although illustrated in FIG. 9 with a single axis loading mechanism, in some aspects loads may delivered in multiple axis, as well as moments. In the case using six real world actuators being loaded with loading mechanisms, system performance may be characterized, and verified, using realistic analytically derived loads from simulated flights.

In an exemplary method 374 of steps according to some embodiments of the present invention, as seen in FIG. 11, using all or part of the system of FIG. 4 as a flight simulator as seen in FIG. 7, a test pilot begins a flight. The flight is of an aircraft which has a CFD mesh prepared, which is defined with respect to the aircraft coordinate frame, and has the computational volume set 301. An initial conditions set of fluid flow and pressure may be set 302 for the computational volume used. The pilot may then input 373 pilot commands into the data exchange module 205, which may send and receive information and commands in a manner which itself simulates the data transfer bus on the real life aircraft. This flight command input may then be routed to the flight control computer module 204, which implements the input, and is also routed to the actuator module 203, which also implements the input 304. For example, the commands may initiate the take-off of the aircraft from the ground by spinning up the rotors. In the case of a fully virtual simulation, virtual actuators represented by the actuator module 203 are used. In the case wherein real world actuators 320a may be used, as in the case of component characterization and testing, the real world actuator or actuators are engaged, as discussed further below. In the case wherein a real world flight computer 320b may be used, as in the case of component characterization and testing, a physical flight computer is used, as discussed further below. The forces are sent to the multi body-dynamics module 217, which can then determine the change in aircraft attitude, position, and altitude based upon the effect of the calculated forces on the aircraft 305. Also, the forces onto the aircraft components are calculated. The forces imparted onto the simulated fluid by the rotors will then be utilized by the fluid dynamics module 216, which then resolves 306 the flow and forces within the computational volume. A full data set related to all parameters has been created 307. All of this information regarding the aircraft may be stored in the data logging module 215, or may be visually represented in the visualization module 216.

The produced data is routed 309 to be utilized 310 in the next time step analysis. For each time step, the forces are updated into the multi body dynamics module 217, including consideration of the changes in actuator power levels and tilt angles as inputted by the flight profile module 231. All updates related to the time step may be synchronized by the time stepping module 230, which may interact with all portions of the realtime simulation framework 231, either through the date exchange module 205, or directly (not shown for clarity). The forces imparted onto the simulated fluid by the rotors will then be utilized by the fluid dynamics module 216, which then again resolves 306 the flow and forces within the computational volume. This repeated set of steps allows for detailed analysis and retention of the parameters as the flight simulation progresses. With this system, the flight command inputs and their resultant forces onto the fluid and flow of the fluid, the forces within the mesh, the resultant forces on the aircraft, and then the changes in aircraft position, speed, and altitude, are all calculated for each time step in a comprehensive integrated fashion. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

What is claimed is:

1. A computer-implemented method of generating a fluid flow simulation over a computational volume, said method comprising:
   obtaining a fluid-flow mesh or grid in computer memory, the fluid flow mesh or grid encompassing a computational volume defined in a first coordinate frame, the fluid flow mesh or grid comprising a plurality of cells or grid points;
   obtaining an aircraft representation based in a second coordinate frame in computer memory;
   obtaining initial conditions for the fluid flow mesh or grid in computer memory;
   obtaining lifting surface elements of said aircraft representation in computer memory, said lifting surface elements representing slices of the lifting surfaces;
   obtaining lift information from aerodynamic tables in computer memory for each slice;
   fixedly coupling said second coordinate frame with said aircraft representation in said first coordinate frame with said computational volume, using a computer processor, wherein said aircraft representation comprises a representation of force actuators onto the fluid;
   determining, using the computer processor, an updated induced velocity of the fluid based upon force inputs from the force actuators representing the aircraft frame using a discretized fluid flow solver;
   determining, using the computer processor, the forces upon said slices of the lifting surfaces;
   using the determined forces upon said slices of the lifting surfaces in said determination of said induced velocity;
   determining, using the computer processor, a local Courant number for each mesh cell within the computational volume;
   determining, using the computer processor, an updated total advection within the computational volume based upon the induced velocity and the aircraft motion, wherein said advection determination method is based upon the local Courant number for each mesh cell or grid point; and
   storing an updated total advection in computer memory.

2. The method of claim 1 further comprising:
   determining, using the computer processor, the fluid velocity at location of a rotor disc in the aircraft representation by sampling a plurality of points in the fluid-flow mesh at points associated with the rotor disc to create an idealized inflow velocity;
   reconstructing the inflow velocity field through said rotor disc from the sampled point;
   and applying the obtained forces and moments onto the fluid volume in a distributed manner.

3. The method of claim 2 further comprising:
   obtaining, in computer memory, a ground reference frame coordinate system;
   placing, using the computer processor, the aircraft frame into said ground reference frame coordinate system in an initial position;
   determining, using the computer processor, changes in the aircraft position and attitude with regard to said ground reference frame coordinate system based upon forces on the aircraft using a multi rigid body simulator.

4. The method of claim 2 further comprising:
   obtaining, in computer memory, a wind reference frame coordinate system;
   placing, using the computer processor, the aircraft frame into said wind reference frame coordinate system in an initial position;
   determining, using the computer processor, changes ii the aircraft position and attitude with regard to said wind reference frame coordinate system based upon forces on the aircraft using a multi rigid body simulator.

5. A flight simulator, said flight simulator comprising:
   a flight simulation terminal adapted to receive commands from a test pilot, said flight simulation terminal coupled to a computer system, said flight simulation terminal comprising flight controls and a visual display; and a computer system comprises a non-transitory computer storage medium comprising computer-executable instructions for generating a flight simulation for:
  obtaining a fluid-flow mesh or grid in computer memory, the fluid flow mesh or grid encompassing a computational volume defined in a first coordinate frame, the fluid flow mesh or grid comprising a plurality of cells or grid points;
  obtaining an aircraft representation based in a second coordinate frame in computer memory;
  obtaining initial conditions for the fluid flow mesh or grid in computer memory;
  obtaining lifting surface elements of said aircraft representation in computer memory, said lifting surface elements representing slices of the lifting surfaces;
  obtaining lift information from aerodynamic tables in computer memory for each slice;
  fixedly coupling said second coordinate frame with said aircraft representation in said first coordinate frame with said computational volume, using a computer processor, wherein said aircraft representation comprises a representation of force actuators onto the fluid;
  determining, using the computer processor, an updated induced velocity of the fluid based upon force inputs from the force actuators representing the aircraft frame using a discretized fluid flow solver;
  determining, using the computer processor, the forces upon said slices of the lifting surfaces;
  using the determined forces upon said slices of the lifting surfaces in said determination of said induced velocity;
  determining, using the computer processor, the local Courant number for each mesh cell within the computational volume;
  determining, using the computer processor, an updated total advection within the computational volume based upon the induced velocity and the aircraft motion, wherein said advection determination method is based upon a local Courant number for each mesh cell or grid point; and
  storing the updated total advection in computer memory;
  obtaining, in computer memory, a ground reference frame coordinate system;
    placing, using the computer processor, the aircraft frame into said ground reference frame coordinate system in an initial position;
    determining, using the computer processor, changes in the aircraft position and attitude with regard to said ground reference frame coordinate system based upon forces on the aircraft using a multi rigid body simulator; and
    creating, using the computer processor, a video output of the simulated flight for viewing on said visual display of said flight simulation terminal based upon the changes in aircraft position and attitude.

6. A component test system, said system adapted to test aircraft components during flight simulations using load experienced during the simulation, said system comprising:
  an aircraft component, said aircraft component electronically coupled to a bench test computer system; and
  a computer system comprises a non-transitory computer storage medium comprising computer-executable instructions for generating a bench test environment for:
    obtaining a fluid-flow mesh or grid in computer memory, the fluid flow mesh or grid encompassing a computational volume defined in a first coordinate frame, the fluid flow mesh or grid comprising a plurality of cells or grid points;
    obtaining an aircraft representation based in a second coordinate frame in computer memory;
    obtaining initial conditions for the fluid flow mesh or grid in computer memory;
    obtaining lifting surface elements of said aircraft representation in computer memory, said lifting surface elements representing slices of the lifting surfaces;
    obtaining lift information from aerodynamic tables in computer memory for each slice;
      fixedly coupling said second coordinate frame with said aircraft representation in said first coordinate frame with said computational volume, using a computer processor, wherein said aircraft representation comprises a representation of force actuators onto the fluid;
      determining, using the computer processor, an updated induced velocity of the fluid based upon force inputs from the force actuators representing the aircraft frame using a discretized fluid flow solver;
      determining, using the computer processor, the forces upon said slices of the lifting surfaces;
      using the determined forces upon said slices of the lifting surfaces in said determination of said induced velocity;
      determining, using the computer processor, a local Courant number for each mesh cell within the computational volume;
      determining, using the computer processor, an updated total advection within the computational volume based upon the induced velocity and the aircraft motion, wherein said advection determination method is based upon the local Courant number for each mesh cell or grid point; and
      storing the updated total advection in computer memory;
    obtaining, in computer memory, a ground reference frame coordinate system;
      determining, using the computer processor, the inputs to be directed to said aircraft component; and
      sending, using the computer processor, the inputs to said aircraft component.

7. The component test system of claim 6 further comprising:
  a load application device, said load application device adapted to provide external loads to said aircraft component,
and wherein said computer storage medium comprising computer-executable instructions for:
  determining, using the computer processor, the loads upon said aircraft component; and
  sending, using the computer processor, instructions to said load application device to load said aircraft component with said loads.

* * * * *